(12) United States Patent
Baldwin et al.

(10) Patent No.: US 9,217,928 B1
(45) Date of Patent: Dec. 22, 2015

(54) CLEAN FLEXOGRAPHIC PRINTING PLATES AND METHOD OF MAKING THE SAME

(71) Applicant: MacDermid Printing Solutions, LLC, Waterbury, CT (US)

(72) Inventors: Kyle P. Baldwin, Acworth, GA (US); Miguel A. Barboza, Fairburn, GA (US); Kerry O'Brate, Decatur, GA (US)

( * ) Notice: Subject to any disclaimer, the term of this patent is extended or adjusted under 35 U.S.C. 154(b) by 0 days.

(21) Appl. No.: 14/458,659

(22) Filed: Aug. 13, 2014

(51) Int. Cl.
*G03F 7/00* (2006.01)
*G03F 7/38* (2006.01)

(52) U.S. Cl.
CPC ........................................ *G03F 7/38* (2013.01)

(58) Field of Classification Search
CPC ........................................................ G03F 7/26
USPC ............................................................ 430/306
See application file for complete search history.

(56) References Cited

U.S. PATENT DOCUMENTS

| | | |
|---|---|---|
| 4,716,094 A | 12/1987 | Minonishi et al. |
| 5,262,275 A | 11/1993 | Fan |
| 5,925,500 A | 7/1999 | Yang |
| 6,238,837 B1 | 5/2001 | Fan |
| 6,291,133 B1 | 9/2001 | Takagi et al. |
| 6,403,269 B1 | 6/2002 | Leach |
| 6,989,226 B2 | 1/2006 | Araki et al. |
| 8,715,906 B2 | 5/2014 | Blanchet et al. |
| 2013/0228086 A1* | 9/2013 | Baldwin et al. ............ 101/401.1 |

FOREIGN PATENT DOCUMENTS

JP 2005-084418 3/2005

* cited by examiner

*Primary Examiner* — Chanceity Robinson
(74) *Attorney, Agent, or Firm* — Carmody Torrance Sandak & Hennessey LLP (57) ABSTRACT

A method is provided for processing a flexographic printing blank to produce a relief image printing element capable of printing cleanly. The method provides a flexographic printing blank comprising: (i) a support layer; (ii) at least one photocurable layer disposed on the support layer, and (iii) a laser ablatable mask layer disposed on the at least one photocurable layer. The laser ablatable mask layer is laser ablated to create an in situ negative in the laser ablatable mask layer. Thereafter, a barrier layer is disposed on the laser ablatable mask layer. The photocurable layer is exposed to actinic radiation through the barrier layer and the laser ablatable mask layer; and the imaged and exposed flexographic printing blank is developed to reveal the relief image therein. The resulting flexographic relief image printing element is capable of printing cleanly and of resisting paper fibers, dust, and ink during a print run.

12 Claims, 5 Drawing Sheets

CLEAN FLEXOGRAPHIC PRINTING PLATES AND METHOD OF MAKING THE SAME

FIELD OF THE INVENTION

The present invention relates generally to the production of flexographic printing plates that are capable of printing cleanly.

BACKGROUND OF THE INVENTION

Flexography is a method of printing that is commonly used for high-volume runs. Flexography is employed for printing on a variety of substrates such as paper, paperboard stock, corrugated board, films, foils and laminates. Newspapers and grocery bags are prominent examples. Coarse surfaces and stretch films can be economically printed only by means of flexography. Flexographic printing plates are relief plates with image elements raised above open areas. Generally, the plate is somewhat soft, and flexible enough to wrap around a printing cylinder, and durable enough to print over a million copies. Such plates offer a number of advantages to the printer, based chiefly on their durability and the ease with which they can be made.

In flexographic printing, ink is transferred from a pool of ink to a substrate by way of a printing plate. The surface of the plate is shaped so that the image to be printed appears in relief, in the same way that rubber stamps are cut so as to have the printed image appear in relief on the surface of the rubber. Typically, the plate is mounted on a cylinder, and the cylinder rotates at a high speed such that the raised surface of the printing plate contacts a pool of ink, is slightly wetted by the ink, then exits the ink pool and contacts a substrate material, thereby transferring ink from the raised surface of the plate to the substrate material to form a printed substrate. Those involved in the flexographic printing industry are constantly striving to improve the flexographic printing process in order to more effectively compete.

The demands placed on flexographic printing plates are numerous. Firstly, a flexographic printing plate must have sufficient flexibility to wrap around a printing cylinder, yet be strong enough to withstand the rigors experienced during typical printing processes. Furthermore, the printing plate should possess a low hardness to facilitate ink transfer during printing. In addition, it is important that the surface of the printing plate remains dimensionally stable during storage.

A typical flexographic printing plate as delivered by its manufacturer is a multilayered article made of a backing (or support) layer; one or more unexposed photocurable layers; a protective layer or slip film; and often a protective cover sheet.

The backing layer lends support to the plate and can be formed from a transparent or opaque material such as paper, cellulose film, plastic, or metal. The photopolymer layer(s) can include any of the known binders (oligomers), monomers, initiators, reactive or non-reactive diluents, fillers, and dyes. The term "photocurable" or "photopolymer" refers to a composition which undergoes polymerization, cross-linking, or any other curing or hardening reaction in response to actinic radiation with the result that the unexposed portions of the material can be selectively separated and removed from the exposed (cured) portions to form a three-dimensional or relief pattern of cured material. Preferred photopolymer materials include an elastomeric compound (binder), an ethylenically unsaturated compound having at least one terminal ethylene group, and a photoinitiator. More than one photocurable layer may also be used.

The photopolymer materials generally cross-link (cure) and harden through radical polymerization in at least some actinic wavelength region. As used herein, actinic radiation is radiation capable of effecting a chemical change in an exposed moiety. Actinic radiation includes, for example, amplified (e.g., laser) and non-amplified light, particularly in the UV and violet wavelength regions.

Many different elastomeric materials have been investigated for the preparation of the photopolymer plates. These include polyamide-based photopolymers (containing a polyamide as an essential component) which dissolves or swells in a washout solution (typically, water, alkaline aqueous solution, or an alcohol), polyvinyl alcohol-based photopolymers (containing polyvinyl alcohol as an essential component), polyester-based photopolymers (containing a low-molecular weight unsaturated polyester as an essential component), acrylic-based photopolymers (containing a low-molecular weight acrylic polymer as an essential component), butadiene copolymer-based photopolymers (containing a butadiene or isoprene/styrene copolymer as an essential component), and polyurethane-based photopolymers (containing polyurethane as an essential component), among others.

A slip film is a thin layer, which rests upon and protects the photopolymer from dust and increases its ease of handling. In a conventional ("analog") plate making process, the slip film is transparent to UV light. The printer peels the cover sheet off the printing plate blank, and places a negative on top of the slip film layer. The plate and negative are then subjected to flood-exposure by UV light through the negative. The areas exposed to the light cure, or harden, and the unexposed areas are removed (developed) to create the relief image on the printing plate. Instead of a slip film, a matte layer may also be used to improve the ease of plate handling. The matte layer typically comprises fine particles (silica or similar) suspended in an aqueous binder solution. The matte layer is coated onto the photopolymer layer and then allowed to air dry. A negative is then placed on the matte layer for subsequent UV-flood exposure of the photocurable layer.

In a "digital" or "direct to plate" plate making process, a laser is guided by an image stored in an electronic data file and is used to create an in situ negative in a digital (i.e., laser ablatable) masking layer. The digital masking layer is typically a slip film which has been modified to include a radiation opaque material. Portions of the laser ablatable layer are ablated by exposing the masking layer to laser radiation at a selected wavelength and power of the laser. Examples of laser ablatable layers are disclosed for example, in U.S. Pat. No. 5,925,500 to Yang, et al., and U.S. Pat. Nos. 5,262,275 and 6,238,837 to Fan, the subject matter of each of which is herein incorporated by reference in its entirety.

After imaging, the photosensitive printing element is developed to remove the unpolymerized portions of the layer of photopolymer material and reveal the crosslinked relief image in the cured photosensitive printing element. Typical methods of development include washing with various solvents or water, often with a brush. Other possibilities for development include the use of an air knife or heat plus a blotter (i.e. thermal development). The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a printing press and printing commenced.

It is required that the printing plate have a relief image that has a chemical resistance to the ink that is used. It is also necessary that the physical and printing properties of the printing plate are stable and do not change during printing. Finally, in order to maintain high quality and clear printing during a run, it is highly desirable that a printing plate not pick up deposits of paper fibers and dried ink, which tend to fill in reverse areas of the plate and deposit at the edges of the printing areas of the plate. When plates pick up excessive deposits during printing, the printing press must be shut down periodically during the run to clean the plates, resulting in a loss of productivity.

Flexographic printing plates that are less likely to accumulate ink during use have been sought for many years, with limited success. The inherent need for the plate to accept ink on its relief surface often conflicts with attempts to limit its accumulation on other parts of the plate during use. Various attempts have been made to create clean relief image printing plates through modifications of the plate chemistry. However, none of these attempts has been very successful, often producing hazy plates that do not image well, or which failed to prevent the accumulation of ink.

Thus, there remains a need in the art for improved sheet photopolymer compositions that are solid at room temperature and that are capable of printing more cleanly and without picking up significant amounts of paper fibers, dust and ink during a print run. In addition, it is also desirable to improve the manufacturing process itself to produce relief image printing plates that are capable of printing cleanly and without picking up significant amounts of paper fibers, dust and ink during a print run.

SUMMARY OF THE INVENTION

It is an object of the present invention to provide an improved sheet polymer plate construction that is capable of printing cleanly during a print run.

It is another object of the present invention to provide an improved method of manufacturing a relief image printing plate that is capable of printing cleanly and that does not pick up significant amounts of paper fiber, dust and ink during a print run.

It is yet another object of the present invention to provide an improved method of manufacturing relief image printing plate that produces a cleaner plate that prints cleanly and looks clean after printing.

To that end, in one embodiment, the present invention relates generally to a method of processing a flexographic printing blank to produce a relief image printing element capable of printing cleanly, the method comprising the steps of:
 a) providing a flexographic printing blank comprising:
  i) a support layer;
  ii) at least one photocurable layer disposed on the support layer, the at least one photocurable layer comprising a photocurable composition comprising:
   1) at least one ethylenically unsaturated monomer;
   2) at least one silicone monomer or oligomer;
   3) at least one binder or oligomer; and
   4) a photoinitiator;
  iii) a laser ablatable mask layer disposed on the at least one photocurable layer;
 b) laser ablating the laser ablatable mask layer to create an in situ negative in the laser ablatable mask layer;
 c) disposing a barrier layer on the laser ablatable mask layer;
 d) exposing the at least one photocurable layer to actinic radiation through the barrier layer and the laser ablatable mask layer; and
 e) developing the imaged and exposed flexographic printing blank to reveal the relief image therein, wherein the relief image comprises a plurality of relief printing dots;
 wherein the resulting flexographic relief image printing element is mountable in a printing press and is capable of printing cleanly and of resisting paper fibers, dust and ink during a print run when mounted in the printing press.

DETAILED DESCRIPTION OF THE PREFERRED EMBODIMENTS

The present invention relates generally to improved sheet polymer compositions that are usable in the production of printing blanks used for producing flexographic relief image printing plates. The present invention also relates generally to an improved method of imaging and developing the flexographic printing blanks to produce relief image printing plates that are capable of printing more cleanly and without picking up significant amounts of paper fibers, dust and ink during printing runs. What is meant by "significant amounts of paper fiber, dust and ink" is that the printing plate can be used continuously for an entire run (for example, at least 5,000 imprints, preferably at least 10,000 imprints or more) without needing to shut down the printing press to clean the plates. What is meant by the printing plate looking "clean" is that the printing plate surface is free of ink or staining and looks substantially the same as a new (i.e., unused) printing plate.

Related U.S. Pat. Pub. No. 2013/0228086 to Baldwin et al., the subject matter of which is herein incorporated by reference in its entirety, describes the use of flexographic relief image printing elements that have silicone incorporated into the matrix of a sheet polymer for use as the floor layer of the relief image printing element, and potentially a portion of the relief.

However, the inventors of the present invention discovered that producing a flexographic printing plate that utilizes a silicone monomer or oligomer in the photocurable layer and that is processed using a laminated barrier membrane produces a clean flexographic printing plate that looks clean after printing and actually prints cleanly. This uncapped plate formulation prints cleanly and was found to look clean after printing as compared with printing plates of the prior art.

It had previously been believed that silicones are bad for printing performance because their presence induces a lack of ink transfer. However, in the present invention, the inventors have discovered that it is possible to produce a printing plate that prints more cleanly and that overcome the deficiencies of the prior art by using a silicone monomer in the photocurable composition in combination with a barrier layer.

Based thereon, in one embodiment, the present invention relates generally to a method of processing a flexographic printing blank to produce a relief image printing element capable of printing cleanly, the method comprising the steps of:
- a) providing a flexographic printing blank comprising:
  - i) a support layer;
  - ii) at least one photocurable layer disposed on the support layer, the at least one photocurable layer comprising a photocurable composition comprising:
    - 1) at least one ethylenically unsaturated monomer;
    - 2) at least one silicone monomer or oligomer;
    - 3) at least one binder or oligomer; and
    - 4) a photo initiator;
  - iii) a laser ablatable mask layer disposed on the at least one photocurable layer;
- b) laser ablating the laser ablatable mask layer to create an in situ negative in the laser ablatable mask layer;
- c) disposing a barrier layer on the laser ablatable mask layer;
- d) exposing the at least one photocurable layer to actinic radiation through the barrier layer and the laser ablatable mask layer; and
- e) developing the imaged and exposed flexographic printing blank to reveal the relief image therein, wherein the relief image comprises a plurality of relief printing dots;

wherein the resulting flexographic relief image printing element is mountable in a printing press and is capable of printing cleanly and of resisting paper fibers, dust and ink during a print run when mounted in the printing press.

As used herein, the term "photocurable" refers to a composition which undergoes polymerization, cross-linking, or any other curing or hardening reaction in response to actinic radiation with the result that the unexposed portions of the material can be selectively separated and removed from the exposed (cured) portions to form a three dimensional or relief pattern of cured material.

The at least one photocurable layer comprises at least one ethylenically unsaturated monomer. Suitable monomers include, for example, multifunctional acrylates, multifunctional methacrylates and polyacryloyl oligomers. Examples of suitable monomers include one or more of ethylene glycol diacrylate, hexanediol diacrylate, diethylene glycol diacrylate, glycerol diacrylate, trimethylol propane triacrylate, hexane diol dimethacrylate, glycerol triacrylate, trimethylolpropane triacrylate, ethylene glycol dimethacrylate, 1,3-propanediol dimethacrylate, 1,2,4-butanetriol trimethacrylate, 1,4-butanediol diacrylate, and combinations of one or more of the foregoing. In a preferred embodiment, the ethylenically unsaturated monomer comprises trimethylol propane triacrylate.

In addition, the at least one photocurable layer also comprise at least one silicone monomer or oligomer. In one embodiment, the at least one silicone monomer or oligomer is selected from the group consisting of aliphatic silicone (meth) acrylate, silicone p-ethyl (meth) acrylate, silicone (meth) acrylate, silicone polyester (meth) acrylate, silicone p-ethyl acrylate, silicone diacrylate, silicone hexacrylate, fluorinated acrylate oligomers, such as UV curable non-CF$_3$ based fluorinated acrylic oligomers with high fluorine containing materials and combinations of one or more of the foregoing. In a preferred embodiment, the silicone monomer or oligomer comprises silicone p-ethyl acrylate or silicone diacrylate.

The silicone monomers or oligomers are used herein in an amount of about 0.01 to about 5 percent by weight, more preferably about 0.05 to about 0.5 percent by weight, and most preferably in an amount of about 0.1 to about 0.2 percent by weight, based on the total weight of the photocurable composition.

Table 1 sets forth various commercially available silicone monomers and oligomers for use in the photocurable layer that have been found to produce a clean running plate.

TABLE 1

Silicone monomers and oligomers

| Monomer | Manufacturer | Type |
| --- | --- | --- |
| CN9800 | Sartomer | Aliphatic silicone acrylate |
| TR2300 | Degussa/Tego | Silicone p-ethyl acrylate |
| TR2700 | Degussa/Tego | Silicone acrylate |
| SIP900 | Miwon/Rahn | Silicone polyester acrylate |
| EB350 | Cytec | Silicone diacrylate |
| EB1360 | Cytec | Silicone hexacrylate |
| CN4002 | Sartomer | Fluorinated acrylate oligomer |
| LR2200 | Miwon/Rahn | Fluorinated monomer |

The photo-initiator absorbs light and is responsible for the production of free radicals or cations. Free radicals or cations are high-energy species that induce polymerization. Suitable photoinitiators for use in the first photocurable composition and the second photocurable composition of the present invention include quinones, benzophenone and substituted benzophenones, hydroxyl alkyl phenyl acetophenones, dialkoxy acetophenones such as 2,2-diethoxyacetophenone and 2,2-dimethoxy-2-phenyl acetophenone, α-halogeno-acetophenones, aryl ketones (such as 1-hydroxycyclohexyl phenyl ketone), 2-hydroxy-2-methyl-1-phenylpropan-1-one, 2-benzyl-2-dimethylamino-(4-morpholinophenyl) butan-1-one, thioxanthones (such as isopropylthioxanthone), benzil dimethylketal, bis(2,6-dimethylbenzoyl)-2,4,4-trimethylpentylphosphine oxide, trimethylbenzoyl phosphine oxide derivatives such as 2,4,6trimethylbenzoyldiphenylphosphine oxide, methyl thio phenyl morpholino ketones such as 2-methyl-1-[4-(methylthio)phenyl]-2-morpholinopropan-1-one, morpholino phenyl amino ketones, 2,2-dimethoxy-1,2-diphenylethan-1-one or 5,7-diiodo-3-butoxy-6-fluorone, diphenyliodonium fluoride and triphenylsulfonium hexafluorophosphate, benzoin ethers, peroxides, biimidazoles, benzyl dimethyl ketal, aminoketones, benzoyl cyclohexanol, oxysulfonyl ketones, sulfonyl ketones, benzoyl oxime esters, camphorquinones, ketocoumarins, Michler's ketone, halogenated alkyl aryl ketones, α-hydroxy-α-cyclohexyl phenyl ketone and combinations of one or more of the foregoing.

The binder or oligomer preferably comprises an A-B-A type block copolymer where A represents a non-elastomeric block, preferably a vinyl polymer or most preferably polystyrene, and B represents an elastomeric block, preferably polybutadiene or polyisoprene. Suitable polymerizable oligomers may also be used in the compositions of the invention and preferred oligomers include those that are polymerized from the monofunctional and/or polyfunctional monomers disclosed above. Particularly preferred oligomers include epoxy acrylates, aliphatic urethane acrylates, aromatic urethane acrylates, polyester acrylates, polyether acrylates, amine modified polyether acrylates and straight-chained acrylic oligomers.

Other optional ingredients for use in the at least one photocurable layer include inhibitors, plasticizers, dyes, polymers, oligomers, pigments, sensitizers, synergists, tertiary organic amines, UV absorbers, thixotropes, anti-oxidants, oxygen scavengers, flow modifiers, fillers and combinations of one or more of the foregoing.

The at least one photocurable layer should cross-link (cure) and, thereby, harden in at least some actinic wavelength region. As used herein, actinic radiation is radiation capable of effecting a chemical change in an exposed moiety. Actinic radiation includes, for example, amplified (e.g., laser) and non-amplified light, particularly in the UV and infrared wavelength regions. Preferred actinic wavelength regions are from about 250 nm to about 450 nm, more preferably from about 300 nm to about 400 nm, even more preferably from about 320 nm to about 380 nm.

The backing (or support) layer lends support to the plate and can be formed from a transparent or opaque material such as paper, cellulose film, plastic, or metal. The backing layer is preferably formed from a variety of flexible, transparent materials. Examples of such materials are cellulose films, or plastics such as, for example, PET (polyethylene terephthalate), PEN (polyethylene naphthalate), polyether, polyethylene, polyamide (Kevlar) or nylon. Preferably, the support layer is formed from polyethylene terephthalate (PET). The support layer is typically from about 0.001 to about 0.010 inches thick.

Optionally, various layers, such as an antihalation layer or an adhesive layer, may be positioned between the backing layer and the photopolymer layer.

A laser ablatable mask layer is disposed on the at least one photocurable layer. In DTP technology, a computer transfers digital information to the laser ablatable mask layer via a laser that is in communication with the computer that ablates those areas of the laser ablatable mask layer that have to cure, i.e., those areas that ultimately become the relief layer. The plate is then face exposed through the in-situ mask. The area of the laser ablatable mask layer that was not ablated prevents the underlying photopolymer from curing and is removed during the processing (development) step. That area where the mask was laser ablated is cured and becomes the relief area. Examples of laser ablatable mask layers are disclosed in, for example, U.S. Pat. No. 5,925,500 to Yang, et al., herein incorporated by reference, which discloses slip films modified with a UV absorber as the mask layer, thus employing a laser to selectively ablate the modified slip film; and U.S. Pat. Nos. 5,262,275 and 6,238,837 to Fan, the subject matter of each of which is herein incorporated by reference in its entirety.

Thereafter, a barrier layer is disposed on top of the relief image printing plate to cover the in situ mask and any uncovered portions of photocurable layer. In a preferred embodiment, the barrier layer is laminated to the surface of the printing plate using pressure and/or heat in a typical lamination process. The membrane can most beneficially be applied after the laser ablation used to create the in situ mask, but before exposure to actinic radiation.

A wide range of materials can serve as the barrier membrane layer. Three qualities that the inventors have identified in producing effective barrier layers include optical transparency, low thickness and oxygen transport inhibition. Oxygen transport inhibition is measure in terms of a low oxygen diffusion coefficient. As noted, the oxygen diffusion coefficient of the membrane should be less than $6.9 \times 10^{-9}$ m$^2$/sec., preferably less than $6.9 \times 10^{-10}$ m$^2$/sec. and most preferably less than $6.9 \times 10^{-11}$ m$^2$/sec.

Examples of materials which are suitable for use as the barrier membrane layer of the present invention include those materials that are conventionally used as a release layer in flexographic printing elements, such as polyamides, polyvinyl alcohol, hydroxyalkyl cellulose, polyvinyl pyrrolidinone, copolymers of ethylene and vinyl acetate, amphoteric interpolymers, cellulose acetate butyrate, alkyl cellulose, butyral, cyclic rubbers, and combinations of one or more of the foregoing. In addition, films such as polypropylene, polyethylene, polyvinyl chloride, polyester and similar clear films can also serve well as barrier films. In one preferred embodiment, the barrier membrane layer comprises a polypropylene film or a polyethylene terephthalate film. One particularly preferred barrier membrane is a Fuji® Final Proof receiver sheet membrane available from Fuji Films.

The barrier membrane should be as thin as possible, consistent with the structural needs for handling of the film and the film/photopolymer plate combination. Barrier membrane thicknesses between about 1 and 100 microns are preferred, with thickness of between about 1 and about 20 microns being most preferred.

The barrier membrane needs to have a sufficient optical transparency so that the membrane will not detrimentally absorb or deflect the actinic radiation used to expose the photosensitive printing blank. As such it is preferable that the barrier membrane have an optical transparency of at least 50%, most preferably at least 75%.

In addition, the barrier membrane needs to be sufficiently impermeable to oxygen diffusion so that it can effectively limit diffusion of oxygen into the photocurable layer during exposure to actinic radiation. The inventors herein have determined that the barrier membrane materials noted above in the thicknesses noted above will substantially limit the diffusion of oxygen into the photocurable layer when used as described herein.

In one embodiment, the at least one photocurable layer may be subjected to a blanket exposure to actinic radiation to crosslink and cure at least a portion of the at least one photocurable layer and create the cured floor layer. As described herein, this floor layer sets the depth of relief for the relief image printing plate. The at least one photocurable layer preferably has a surface energy of between about 18 and about 25 dynes/cm when cured. It has been found that the low surface energy of the at least one photocurable layer enables the at least one photocurable layer to avoid picking up significant amounts of paper fibers, dust and ink during a print run.

Once the printing element has been imagewise exposed to actinic radiation to create the relief image, the printing element is developed to remove the unpolymerized portions and reveal the crosslinked relief image. Typical methods of development include washing with various solvents or water, often with a brush. Other possibilities for development include the use of an air knife or heat plus a blotter (thermal development). The resulting surface has a relief pattern that reproduces the image to be printed. The relief pattern typically comprises a plurality of dots, and the shape of the dots and the depth of the relief, among other factors, affect the quality of the printed image. After the relief image is developed, the relief image printing element may be mounted on a press and printing commenced.

Most flexographic printing plates are also uniformly post-exposed to ensure that the photopolymerization process is complete and that the plate will remain stable during printing and storage. This post-exposure step utilizes the same radiation source as the main exposure.

Detackification (which can also be referred to as light finishing) is an optional post-development treatment which can be applied if the surface is still tacky, such tackiness not generally being removed in post-exposure. Tackiness can be eliminated by methods known in the art, such as treatment with bromine or chlorine solutions.

Examples

The inventors of the present invention processes a series of uncapped clean plate formulations with and without the barrier layer laminated thereto and with and without the inclusion of a silicone monomer. The results are presented below.

Figure 1A:
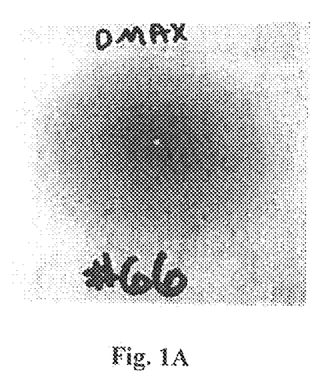
FIGS. 1A and 1B depict a circular vignette print region for printing plates processed without a laminated barrier layer and with a laminated barrier layer.
Figure 1B:
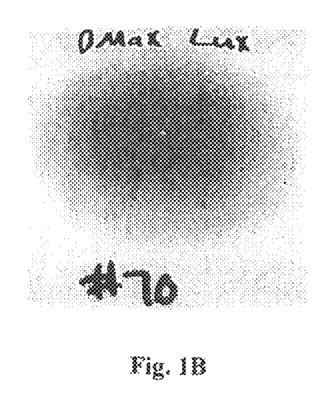

FIGS. 1A and 1B depict a circular vignette print region for printing plates processed without a laminated barrier layer (FIG. 1A) and with a laminated barrier layer (FIG. 1B). As seen in FIGS. 1A and 1B, the printed plate appears cleaner with the use of a barrier layer than without, but both plates printed dirty vignettes.

A clean plate formulation was prepared according to the present invention using an aliphatic silicone acrylate (CN9800, available from Sartomer, Inc.) as the silicone monomer in the photocurable layer. In order to determine whether the use of a barrier layer inherently produces dirty plates, this clean plate formulation was printed with and without the laminated barrier layer.

Figure 2A:
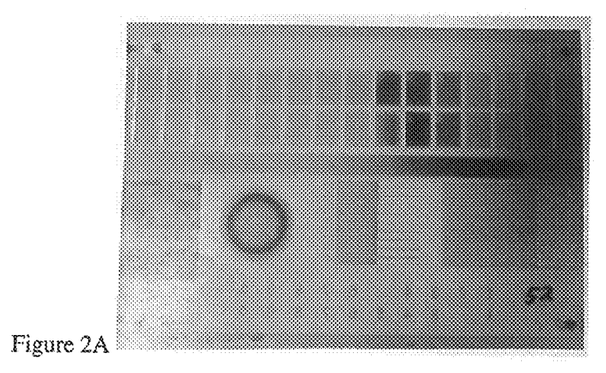
FIGS. 2A and 2B depict results of printing using plates in accordance with the present invention without a laminated barrier layer and with a laminated barrier layer.
Figure 2B:
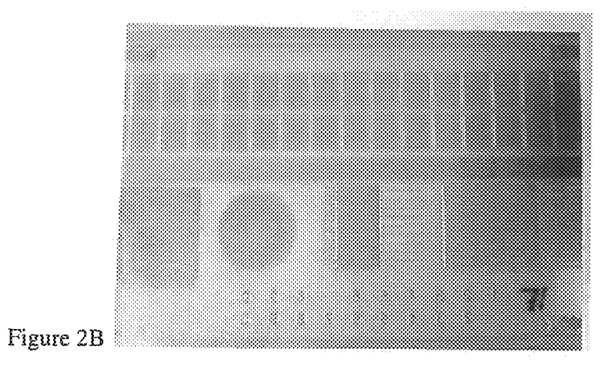
Figure 3A:
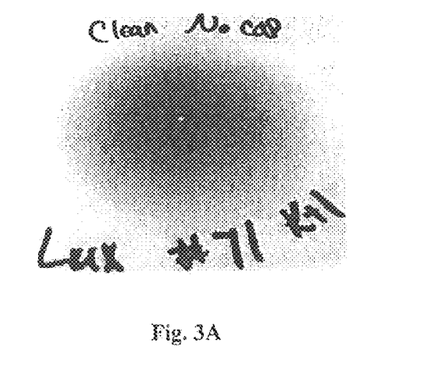
FIGS. 3A and 3B depict a circular vignette print region for printing plates in accordance with the present invention processed without a laminated barrier layer and with a laminated barrier layer.
Figure 3B:
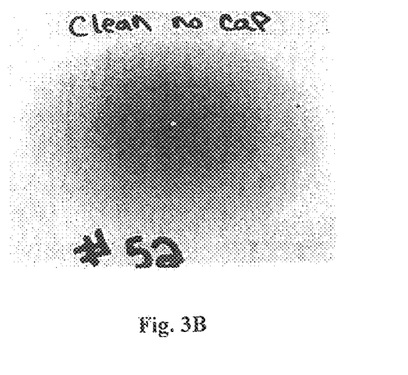

The result was astounding. As seen in FIG. 2A (printing without the laminated barrier layer) and FIG. 2B (printing with the laminated barrier layer), instead of printing dirtier, the plate with the laminated barrier layer came off the press looking clean and it also printed the vignette cleanly as seen in FIG. 3B. In comparison, the clean plate formulation printing without the laminated barrier layer did not print the vignette as cleanly, as can be seen in FIG. 3A.

Figure 4A:
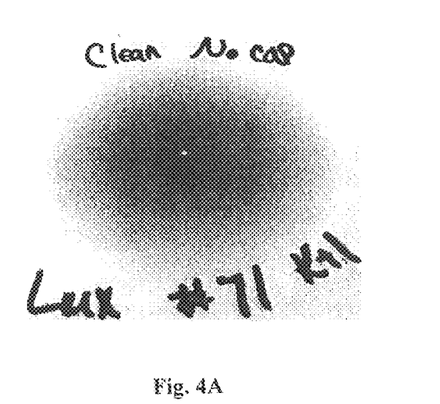
FIGS. 4A and 4B depict clean plate formulations at low impression levels and high impression levels.
Figure 4B:
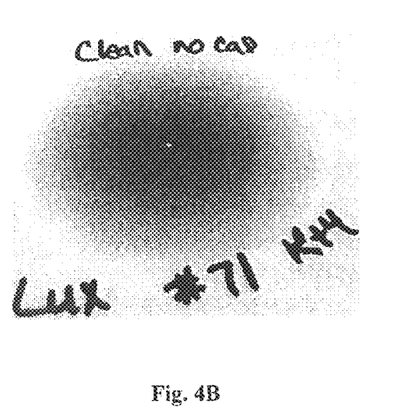

To eliminate the question of whether the clean print was the result of impression level, the vignette was analyzed at both low and high impression levels. FIG. 4A depicts the clean plate formulation at low impression levels and FIG. 4B depicts the clean plate formulation at high impression levels. As can be seen from FIGS. 4A and 4B, there is no observable difference in the smoothness at the higher impression level.

Figure 5A:
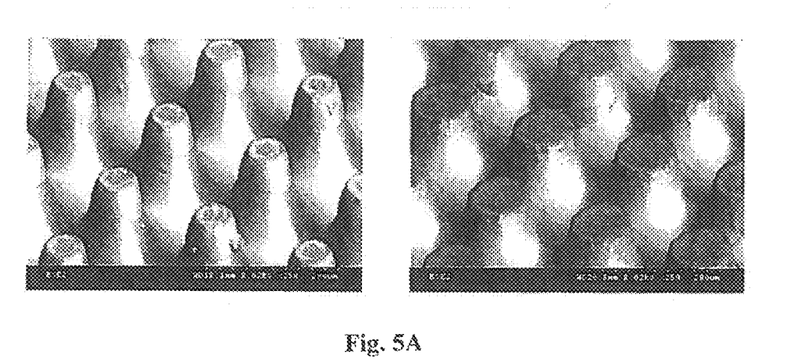
FIGS. 5A and 5B depict the difference between the dot shape of plates processed without a laminated barrier layer and with a laminated barrier layer.
Figure 5B:
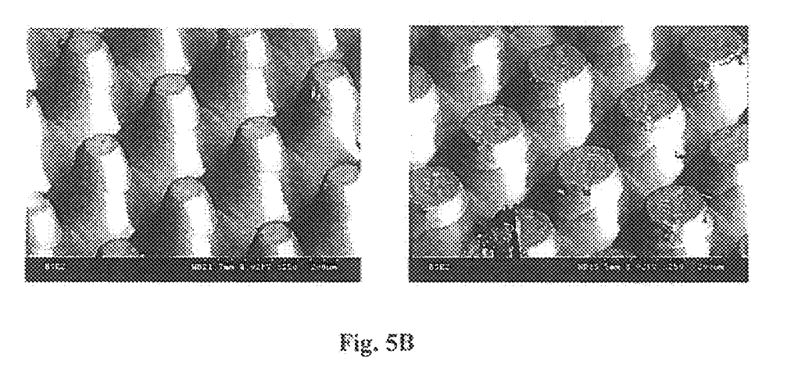

However, as depicted in FIGS. 5A and 5B, demonstrate the dot shape between the printing plate processed without the barrier layer (FIG. 5A) and the printing plate processed with the barrier layer (FIG. 5B) is very different. The dots printed with the barrier layer were broader than the dots printed without the barrier layer. The clean printing seems unlikely to be related to dot size or shape. Thus, it is clear that there is something in the plate formulation that interacted favorably with the lack of oxygen afforded by the laminated barrier layer.

Figure 6:
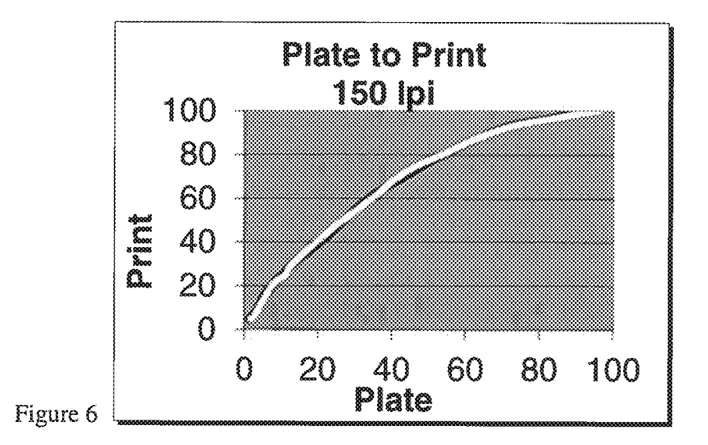
FIG. 6 depicts dot gain curves for conventional plates processed with a barrier layer as compared with printing plates of the present invention processed with a barrier layer.

FIG. 6 depicts dot gain curves for conventional printing plates processed with a barrier layer (black) and printing plates of the invention processed with a barrier layer (white). As can be seen the printed gains were similar for both plates.

The results described herein were surprising because it was originally thought that printing plates made with a laminated barrier layer made dirtier prints than standard plates processed without a barrier layer. However, it can be seen that the printing plates having the photocurable layer described herein and processed with a laminated barrier layer demonstrate a significant advantage in clean printing.

It is important to note that the dot shape or flatness is not relevant to the clean plate discussion. The use of the laminated barrier layer was shown to create wider dot profiles than plates processed without the barrier layer. Thus, the phenomenon must be related to the surface, but it is not surface energy alone. Some formulations were printed that had much lower surface energies than the photocurable composition described herein processed with the barrier layer. The inventors believe that it must be related to the lack of oxygen when curing a barrier laminated plate versus a standard digital plate. However, as no advantage was observed with the use of the barrier layer alone, it can be seen that the silicone monomer in the plate formulation must also play a role.

What is claimed is:

1. A method of processing a flexographic printing blank to produce a relief image printing element capable of printing cleanly, the method comprising the steps of:
   a) providing a flexographic printing blank comprising:
      i) a support layer;
      ii) at least one photocurable layer disposed on the support layer, the at least one photocurable layer comprising a photocurable composition comprising:
         1) at least one ethylenically unsaturated monomer;
         2) at least one silicone monomer or oligomer; and
         3) at least one binder or oligomer; and
         4) a photoinitiator
      iii) a laser ablatable mask layer disposed on the at least one photocurable layer;
   b) laser ablating the laser ablatable mask layer to create an in situ negative in the laser ablatable mask layer;
   c) disposing a barrier layer on the laser ablatable mask layer;
   d) exposing the at least one photocurable layer to actinic radiation through the barrier layer and the laser ablatable mask layer; and
   e) developing the imaged and exposed flexographic printing blank to reveal a relief image therein, wherein the relief image comprises a plurality of relief printing dots;
   wherein the resulting relief image printing element is mountable in a printing press and is capable of printing cleanly and of resisting paper fibers, dust and ink during a print run when mounted in the printing press.

2. The method according to claim 1, wherein the at least one silicone monomer or oligomer is selected from the group consisting of aliphatic silicone (meth) acrylate, silicone p-ethyl (meth) acrylate, silicone (meth) acrylate, silicone polyester (meth) acrylate, silicone p-acrylate, silicone diacrylate, silicone hexacrylate and combinations of one or more of the foregoing.

3. The method according to claim 2, wherein the at least one silicone monomer or oligomer comprises silicone p-ethyl acrylate or silicone diacrylate.

4. The method according to claim 1, wherein the at least one silicone monomer is present in the photocurable composition at a concentration of between about 0.01 to about 5.0 percent by weight, based on the total weight of the photocurable composition.

5. The method according to claim 4, wherein the at least one silicone monomer is present in the photocurable layer at a concentration of between about 0.05 to about 0.5 percent by weight, based on the total weight of the photocurable composition.

6. The method according to claim 5, wherein the at least one silicone monomer is present in the photocurable layer at a concentration of about 0.1 to about 0.2 percent by weight, based on the total weight of the photocurable composition.

7. The method according to claim 1, wherein the barrier layer is disposed on the laser ablatable mask layer by laminating the barrier layer to the photocurable layer.

8. The method according to claim 1, wherein the barrier layer is disposed on the laser ablatable mask after the laser ablation step but before the exposure to actinic radiation step.

9. The method according to claim 1, wherein the barrier layer comprises a material selected from the group consisting of polyamides, polyvinyl alcohol, hydroxyalkyl cellulose, polyvinyl pyrrolidinone, copolymers of ethylene and vinyl acetate, amphoteric interpolymers, cellulose acetate butyrate, alkyl cellulose, butyral, cyclic rubbers, and combinations or one or more of the foregoing.

10. The method according to claim 1, wherein the barrier layer comprises a film selected from the group consisting of polypropylene, polyethylene, polyvinyl chloride, polyester and combinations of one or more of the foregoing.

11. The method according to claim 10, wherein the barrier layer comprises a polypropylene film or a polyethylene terephthalate film.

12. A relief image printing element produced by the process of claim 1.

* * * * *